United States Patent [19]

Head

[11] 4,119,905

[45] Oct. 10, 1978

[54] PROGRAMMABLE ALTERNATING CURRENT SWITCH

[75] Inventor: Dale R. Head, Savage, Minn.

[73] Assignee: Precision, Inc., Minneapolis, Minn.

[21] Appl. No.: 838,057

[22] Filed: Sep. 30, 1977

[51] Int. Cl.[2] .................... G05F 3/04; H03K 17/72

[52] U.S. Cl. .................... 323/21; 307/252 F; 307/252 B; 323/24; 323/34

[58] Field of Search .......... 307/252 B, 252 F, 252 J, 307/311, 305; 323/18, 22 SC, 21, 24, 34

[56] References Cited

U.S. PATENT DOCUMENTS

| | | | |
|---|---|---|---|
| 3,328,606 | 6/1967 | Pinckaers | 307/252 B |
| 3,524,997 | 8/1970 | Harnden, Jr. et al. | 307/252 B |

*Primary Examiner*—John Zazworsky

*Attorney, Agent, or Firm*—Orrin M. Haugen; Thomas J. Nikolai

[57] ABSTRACT

A programmable alternating current switch for connecting an A.C. supply to a load for a controlled fraction of each cycle to thereby control the average power to loads, such as lamps, heaters, motors, etc. A Programmable Unijunction Transistor (PUT) is employed to control the phase angle of the A.C. wave at which a Triac is fired, the Triac continuing to conduct and deliver load current for the remainder of that half-cycle. Coupled between the PUT and the Triac is a Light Activated Silicon Controlled Rectifier (LASCR) and a diode bridge which provides full-wave operation.

8 Claims, 2 Drawing Figures

PROGRAMMABLE ALTERNATING CURRENT SWITCH

BACKGROUND OF THE INVENTION

I. Field of the Invention

This invention relates generally to solid-state load current control apparatus and more specifically to a programmable alternating current switch for coupling an A.C. source to a load, such that the average power delivered to the load may be controlled in a desired (programmed) fashion.

II. Description of the Prior Art

Various types of solid-state phase control circuits are well-known in the art. For typical arrangements, reference is made to Page 399 of a book entitled "Integrated Circuits and Semiconductor Devices: Theory and Application" by Gordon J. Deboo and Clifford N. Burrous, published by McGraw-Hill, Inc. (Copyright 1977, 1971.) Also, reference is made to the Lorenz Pat. No. 3,746,887 for its teaching of an A.C. phase angle control circuit which includes a PUT that governs the firing of a Triac switch that is coupled in series between a source and a load. The Pascente Pat. No. 3,917,962 is also cited for its showing of an optical coupler (phototransistor) in combination with an A.C. phase control circuit.

SUMMARY OF THE INVENTION

The present invention relates to a circuit which is capable of delivering a constant amplitude, A.C. current to a load and which is responsive to a control signal input to vary the time during each one-half cycle of the applied A.C. voltage that current may flow through the load. As such, the circuit of the present invention is ideally suited for controlling the lamp intensity in audio-visual equipment so as to provide a fade-in and fade-out capability.

In accordance with the teachings of the present invention there is provided a Programmable Unijunction Transistor having a RC timing circuit coupled to its anode electrode and having a gate-anode electrode adapted to receive a control signal for programmably determining the point at which the PUT will be driven into conduction. The output of the PUT drives a thyristor which, in turn, controls the activation of a LASCR device. The switching terminals of the LASCR are isolated from the gate electrode of a Triac load current switching device by means of a diode full-wave rectifier bridge, the arrangement being such that the Triac is turned on at a point in the A.C. cycle determined by the control signal applied to the PUT and continues to conduct for the remainder of that cycle to thereby modulate the line current flowing to the load.

The inventive programmable A.C. switch is simple in design and is yet quite sensitive. A control signal varying in amplitude between +1.5 volts and 10 volts is effective to control the firing of the Triac from substantially 0° through 180° of the applied A.C. input voltage. At the beginning of each cycle, a relatively short duration quenching pulse is applied to the PUT and to the SCR which it drives to ensure that these components are turned off in synchronism with the zero crossing of the applied A.C. supply voltage. As such, each cycle is initiated at the same point even in the presence of inherent noise which might otherwise produce false triggering and unstable operation.

These and other features and advantages of the invention will become apparent from the following detailed description of the preferred embodiment when considered in light of the accompanying drawings in which:

DESCRIPTION OF THE PREFERRED EMBODIMENT

Figure 1:
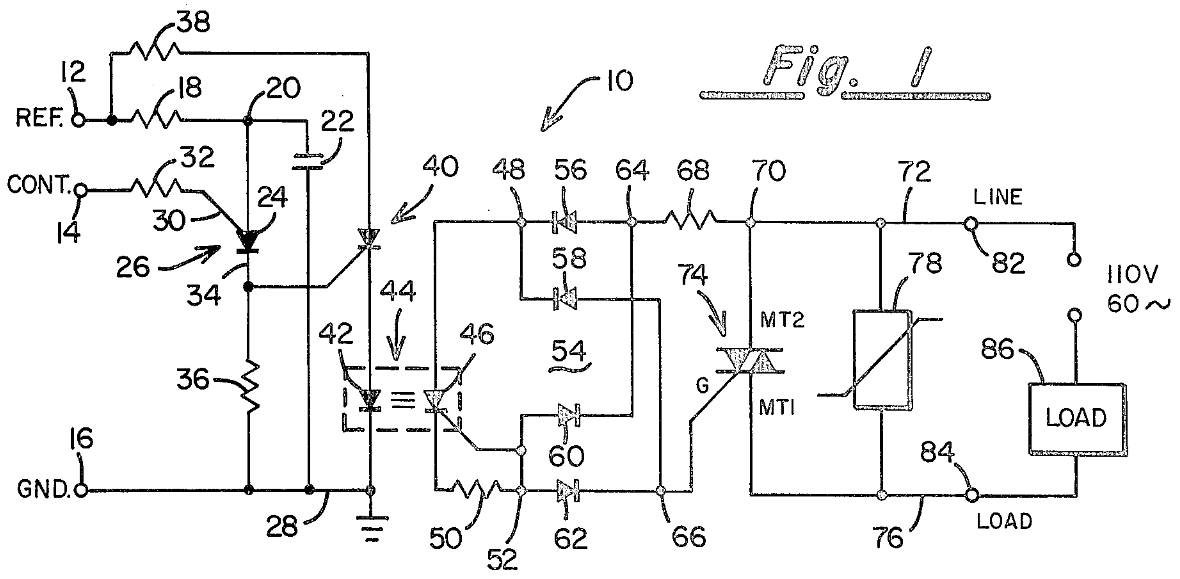
FIG. 1 is a electrical schematic diagram of the preferred embodiment.

Referring first to FIG. 1, a description of the construction of the preferred embodiment will be set forth. Following this, the mode of operation thereof will be described.

The programmable alternating current switch of the present invention is identified generally by numeral 10. Shown at the left in the schematic drawing are terminals 12, 14 and 16 which are respectively labeled "reference" (REF.), "control" (CONT.) and "ground" (GND.). The reference terminal 12 is coupled through a resistor 18 to a junction point 20 which is common to a first terminal of a capacitor 22 and to the anode electrode 24 of a Programmable Unijunction Transistor (PUT) indicated generally by numeral 26. The remaining terminal of the capacitor 22 is connected to the ground bus 28. The anode-gate electrode 30 of PUT 26 is coupled to the control terminal 14 by way of a resistor 32. The cathode electrode 34 of the PUT 26 is coupled through a resistor 36 to the ground bus 28.

A resistor 38 couples the reference input terminal 12 to the anode electrode of a SCR indicated generally by numeral 40. The gate electrode of the SCR is connected to the common point between the cathode electrode 34 of the PUT 26 and the upper terminal of the resistor 36. Connected in series with the cathode electrode of the SCR 40 is the light emitting diode 42 portion of a Light Activated Silicon Controlled Rectifier (LASCR) indicated generally by numeral 44. The other terminal of the LED 42 is connected to the ground bus 28.

The SCR portion 46 of the LASCR 44 has its anode electrode coupled to a junction point 48 and its cathode electrode coupled through a resistor 50 to a junction point 52. A full-wave diode rectifier bridge, indicated generally by numeral 54 is disposed between the junction points 48 and 52. More specifically, the bridge 54 includes semiconductor diodes 56, 58, 60 and 62. The cathode electrodes of the diodes 56 and 58 are coupled to the junction point 48 while the anode electrodes of the semiconductor diodes 60 and 62 are connected to the junction point 52. The anode electrodes of diodes 56 and 58 are respectively connected to junction points 64 and 66. Similarly, the cathode electrodes of diodes 60 and 62 are respectively connected to the junctions points 64 and 66. A resistor 68 is connected in series between junction point 64 and a junction point 70 between a conductor 72 and Main Terminal 2 of a Triac-type thyristor indicated generally by numeral 74. Main Terminal 1 of the Triac 74 is connected to a bus 76. The gate electrode of Triac 74 is connected to the junction point 66.

Connected in parallel with the Triac 74 across the conductors 72 and 76 is a transient suppressing device 78.

Connected to conductor 72 is a terminal 82 which is otherwise identified as the "Line" terminal. Similarly, connected to conductor 76 is a terminal 84 termed the "Load" terminal. A first terminal of a source of alternating current voltage is adapted to be connected to the Line terminal 82 while the other terminal of the source is adapted to be connected to one side of the load element 86. The other terminal of the load 86 is adapted to be connected to the Load terminal 84.

This completes the description of the construction of the preferred embodiment of the invention. Consideration will next be given to its mode of operation and, in this regard, the waveforms of FIG. 2 will be referred to.

Figure 2:
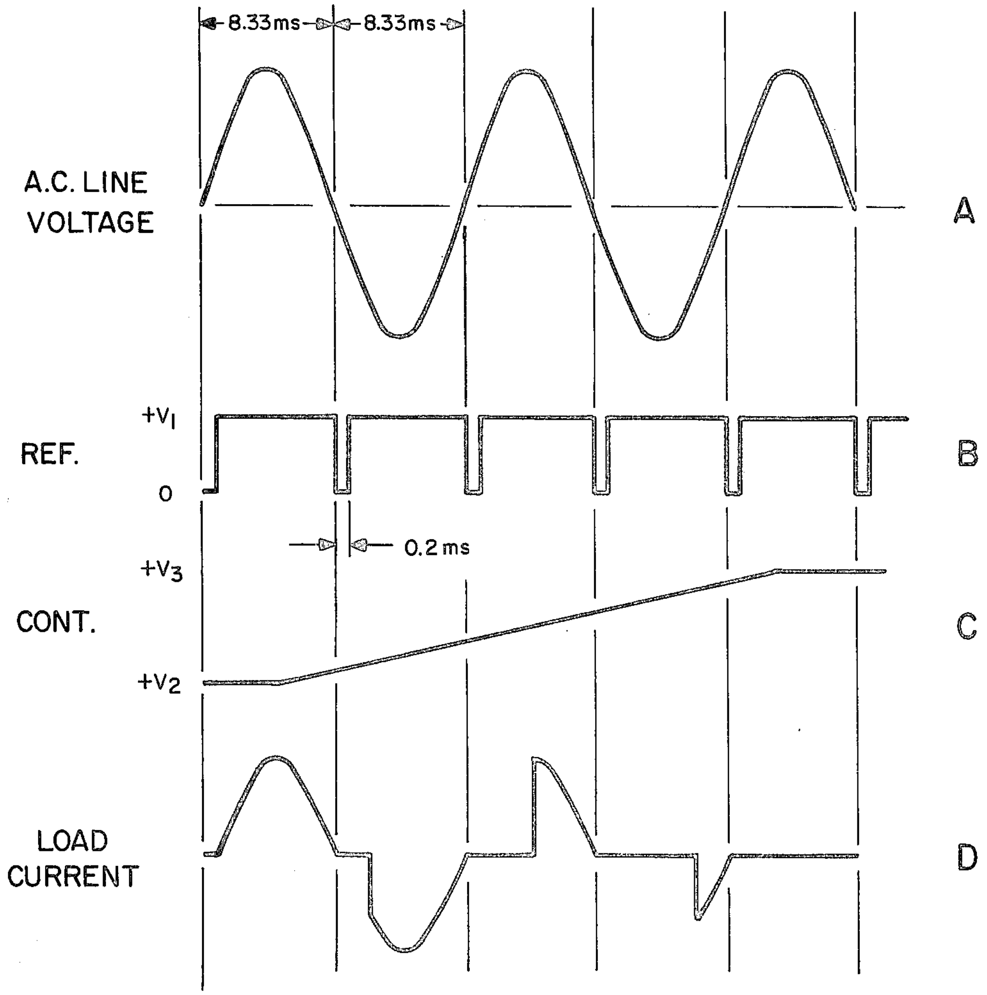
FIG. 2 illustrates typical wave forms useful in understanding the mode of operation of the embodiment of FIG. 1.

Waveform A in FIG. 2 represents the A.C. source voltage and may typically be 120 volts, 60Hz voltage. Waveform B illustrates the reference signal continuously applied to the input terminal 12 in FIG. 1. As can be seen from the waveform of FIG. 2 B, at the beginning of each half-cycle of the line voltage, the reference voltage drops from a value $+V_1$ to 0 or ground. A short time later, typically 200 to 250 microseconds later, the reference voltage again assumes the value $+V_1$ and remains at that level for the rest of the half-cycle. The waveform of FIG. 2 C represents the manner in which the control signal applied to the terminal 14 in FIG. 1 may be varied. While it is illustrated as a ramp starting at a low value of $+V_2$ volts and flattening out at a higher voltage $+V_3$, it is to be understood that the control voltage can be made to vary with time in any fashion between these two voltage values so as to yield a desired load current variation through the load. Finally, the waveform of FIG. 2 D depicts the load current when the control signal of waveform C is impressed on the control terminal 14 in FIG. 1.

As is well-known in the art, a PUT is driven into conduction when its anode terminal becomes more positive than its gate terminal by about 0.7 volts. Let it be assumed that operation begins when the reference signal applied to terminal 12 (waveform B) goes from its $+V_1$ level to ground. This reference signal, being coupled to the anode electrodes of the PUT 26 and the SCR 40 by way of resistors 18 and 38, respectively, ensures that these two semiconductor devices will be in their non-conducting condition. The capacitor 22 will have substantially zero charge built up thereon, having been discharged during the preceding cycle.

Now, when the reference signal applied to terminal 12 again returns to its $V_1$ value, the voltage on the anode electrode 24 of the PUT 26 begins to exponentially increase at a rate determined by the values of resistor 18 and capacitor 22. When the charge on the capacitor is such that the anode voltage of the PUT 26 exceeds the anode-gate voltage on electrode 30 by approximately 0.7 volts, the PUT 26 fires and the capacitor 22 rapidly discharges through the anode to cathode path of the PUT 26 and the resistor 36 which is connected to the ground conductor 28. At the same time, a positive pulse will be applied to the gate electrode of the SCR 40. This positive pulse turns on the SCR 40 and a current path is established from the reference source connected to the terminal 12, through the resistor 38 and through the anode to cathode path of the SCR 40 to energize the LED 42 of the LASCR 44.

The LASCR is triggered into the conducting state when the radiant energy falling on it exceeds a given threshold level. The light emitted from the diode 42 is dependent upon the level of conduction of current therethrough and, within limits, may be adjusted to meet the threshold requirements by proper choice of resistance value for the resistor 38.

Considering the operation of the programmable alternating current switch 10 prior to the triggering of the SCR 40 and the attendant illumination of the LED 42, the SCR 46 is nonconducting and no gate current is available to the Triac 74. Hence, the Triac 74 is nonconducting and a load current is precluded from flowing through the load 86. When the SCR 46 is activated by the light emitted from the LED 46, it is turned on and a current path is established from the 110 volt A.C. source through conductor 72, resistor 68, forward biased diode 56, the now-conducting SCR 46, the resistor 50 and the forward biased diode 62 to the gate electrode of the Triac 74. This gate current turns on the Triac 74 and permits load current to flow from the 110 volt source, through conductor 72, the now-conducting Triac 74 and the conductor 76 back through the load 86 to the other terminal of the A.C. source. This current will continue to flow until the completion of a half-cycle of the A.C. line voltage. When the line voltage goes to zero, the Triac 74 is rendered non-conductive and must be re-triggered. Re-triggering occurs in the fashion already described such that on the negative excursion of the A.C. line voltage a current path is established from the 110 volt source, through the load 86, through conductor 76 and the MT1 to gate path of Triac 74, through the semiconductor diode 58 to the junction 48 and from there through the now-conducting SCR 46, through resistor 50 and semiconductor diode 60 to the junction 64 and through the resistor 68 to the other side of the source. The flow of gate current in the Triac 74 turns on the Triac such that the load current path is completed from the source, through load 86, conductor 76, now-conducting Triac 74 and the conductor 72 back to the other side of the source. Thus, it can be seen that the circuit is operative, irrespective of the instantaneous polarity of the source, in that the Triac 74 is a bidirectional conducting device which can be triggered by either positive or negative gate currents.

The programming features of the alternating current switch 10 is attributed to the fact that the PUT 26 can be selectively biased by a control signal applied to its gate electrode 30 and by the fact that, in order to conduct, its anode electrode 24 must be more positive than the gate electrode 30 by a predetermined amount. Hence, the time required for the capacitor 22 to become charged up sufficiently to exceed the gate bias varies as a function of that bias. When the control signal is at a relatively low value, e.g., $+V_2$, sufficient charge is developed on the capacitor 22 early in the cycle and triggering therefore occurs at an early point in the cycle. However, as the control voltage applied to the terminal 14 increases, more time is required for the charge on the capacitor 22 to reach a value where the anode electrode 24 of the PUT 26 is more positive than the control potential on the gate electrode 30 and, accordingly, triggering does not occur until later in the cycle. This operation is rather clearly indicated in waveform D of FIG. 2.

Because Triac devices are somewhat vulnerable to transient spikes and the like, the transient suppressor 78 is connected between Main Terminal 1 and 2 of the Triac 74. A so-called Thyrector diode is readily suited to perform this function.

It might also be mentioned that it is a relatively simple matter to develop the "reference" signal which is applied to the input terminal 12 of the programmable A.C. switch 10. Specifically, the power supply used to develop the D.C. control voltage $+V_1$ (waveform B)

would generally include an A.C. to D.C. converter involving a full wave rectifier bridge and filter capacitor. As such, it is possible to tap off the 120Hz ripple voltage from the full wave bridge, provided the bridge has been diode isolated from the filter capacitor. This 120 cycle ripple voltage may then be pulse shaped in a suitable operational amplifier to provide the quenching segment of waveform B of FIG. 2.

With no limitation intended, it is deemed beneficial for a full understanding of the operation of the preferred embodiment to set forth typical component values which may be utilized in the implementation of the preferred embodiment.

TABLE I

| | |
|---|---|
| $R_{38}$ | 330 ohms |
| $R_{18}$ | 33k ohms |
| $R_{32}$ | 100k ohms |
| $R_{36}$ | 470 ohms |
| $R_{50}$ | 27k ohms |
| $R_{68}$ | 100 ohms |
| $C_{22}$ | 0.1 microfarads |
| $PUT_{26}$ | Type MPU 131 (Motorola, Inc.) |
| SCR40 | Type 2N5061 |
| OC44 | Type H11C2 |
| Diodes 56, 58, 60 and 62 | Type 1N4007 |
| Triac 74 | Type SC146 |
| Transient Suppressor | V130LA20B(General Electric, Inc.) |
| Reference voltage $V_1$ | 0 to 12 volts |
| Control voltage $V_2$ | 1.5 volts |
| Control voltage $V_3$ | +10 volts |

While a single embodiment of the present invention has been illustrated and described herein in considerable detail, the invention is not to be considered limited to the precise construction shown. It is the intention to cover hereby all adaptations, modifications and uses of the invention which come within the scope of the appended claims.

What is claimed is:

1. A programmable alternating current switch for controlling the average power delivered to a load during half-cycles of an alternating current source voltage, comprising:
(a) a source terminal adapted to be connected to a source of alternating current voltage and a load terminal adapted to be connected to a load, the current through which is to be controlled;
(b) a bidirectional semiconductor switching device having a gate electrode and first and second Main Terminals, respectively connected to said load terminal and said source terminal;
(c) a light activated semiconductor switching device having first and second electrodes;
(d) current steering means including said first and second electrodes of said light activated semiconductor switching device coupling said gate electrode of said bidirectional semiconductor switching device to said source terminal such that when said light activated semiconductor switching device is in a non-conducting state, current is blocked from flowing from said source terminal through said gate electrode but when said light activated semiconductor switching device is in a conductive state, current may flow from said source terminal through said gate electrode, irrespective of the instantaneous polarity of said source terminal;
(e) a programmable unijunction transistor having an anode electrode, a cathode electrode and an anode-gate electrode;
(f) means for applying a time varying voltage to said anode electrodc of said programmable unijunction transistor and a predetermined bias signal to said gate electrode of said programming unijunction transistor;
(g) a source of light energy optically associated with said light activated semiconductor switching device; and
(h) means coupling said cathode electrode of said programmable unijunction transistor to said source of light energy.

2. Apparatus as in claim 1 wherein said current steering means comprises:
(a) a full-wave, diode rectifier bridge circuit having a first terminal coupled to said source terminal, a second terminal coupled to said gate electrode and third and fourth terminals connected individually to said first and second electrodes of said light activated semiconductor switching device.

3. Apparatus as in claim 2 wherein said means coupling said cathode electrode of said programmable unijunction transistor to said source of light energy comprises a silicon controlled rectifier having its gate electrode connected to the cathode electrode of said programmable unijunction transistor, its anode electrode adapted to be coupled to a source of positive potential and its cathode electrode coupled to said source of light energy.

4. Apparatus as in claim 3 wherein said source of light energy comprises a light emitting diode.

5. Apparatus as in claim 1 wherein said light activated semiconductor switching device is a light activated silicon controlled rectifier.

6. A programmable alternating current switch for controlling the average power delivered from an alternating current voltage source to a load during each half-cycle of said alternating current voltage, comprising:
(a) means including a bidirectional, triggerable semiconductor switch connected in series circuit between said source and said load; and
(b) a triggering circuit operatively connected to said triggerable semiconductor switch, said triggering circuit including,
1. a diode bridge circuit adapted to be coupled between alternating current voltage source and said triggerable semiconductor switch;
2. a light activated semiconductor switching device operatively connected to said diode bridge for blocking the flow of current therethrough when said light activated semiconductor switching device is in a non-conducting condition and for allowing the flow of current therethrough when said light activated semiconductor switching device is in a conducting condition, irrespective of the instantaneous polarity of said alternating current voltage, and
3. means sychronized with the initiation of each of said half-cycles of said alternating current voltage for optically energizing said light activated semiconductor switching device at selected predetermined times following the initiation of each of said half-cycles.

7. Apparatus as in claim 6 wherein said last mentioned means comprises:
(a) a programmable unijunction transistor having an anode electrode, a cathode electrode and an anode-gate electrode;
(b) a light emitting diode optically coupled to said light activated switching device and electrically coupled to said cathode electrode of said programmable unijunction transistor;

(c) a source of bias potential connected to said anode-gate electrode of said programmable unijunction transistor; and (d) a resistance-capacitance timing circuit operatively coupled to said anode electrode of said programmable unijunction transistor.

8. Apparatus as in claim 8 and further including a means for applying a first potential to said resistance-capacitance timing circuit for a relatively short duration at the initiation of each half-cycle of said alternating current voltage and a second potential to said resistance-capacitance timing circuit for the remainder of each half-cycle of said alternating current voltage.

* * * * *